United States Patent
Xiong et al.

(10) Patent No.: US 9,972,662 B2
(45) Date of Patent: May 15, 2018

(54) PIXEL STRUCTURE, METHOD FOR MANUFACTURE THE SAME AND DISPLAY PANEL

(71) Applicants: TIANMA MICRO-ELECTRONICS CO., LTD., Shenzhen (CN);
SHANGHAI TIANMA AM-OLED CO., LTD., Shanghai (CN)

(72) Inventors: Zhiyong Xiong, Shanghai (CN);
Liujing Fan, Shanghai (CN)

(73) Assignees: TIANMA MICRO-ELECTRONICS CO., LTD., Shenzhen (CN);
SHANGHAI TIANMA AM-OLED CO., LTD., Shanghai (CN)

( * ) Notice: Subject to any disclaimer, the term of this patent is extended or adjusted under 35 U.S.C. 154(b) by 0 days. days.

(21) Appl. No.: 15/194,326

(22) Filed: Jun. 27, 2016

(65) Prior Publication Data

US 2017/0194386 A1    Jul. 6, 2017

(30) Foreign Application Priority Data

Dec. 30, 2015   (CN) .......................... 2015 1 1027979

(51) Int. Cl.
*H01L 27/32* (2006.01)
*H01L 51/52* (2006.01)
(Continued)

(52) U.S. Cl.
CPC ...... *H01L 27/3211* (2013.01); *H01L 51/0011* (2013.01); *H01L 51/504* (2013.01);
(Continued)

(58) Field of Classification Search
CPC ............... H01L 27/3211; H01L 51/504; H01L 51/5228; H01L 51/56; H01L 51/0011
See application file for complete search history.

(56) References Cited

U.S. PATENT DOCUMENTS 5,113,274 A * 5/1992 Takahashi ............ G09G 3/3607
                                                    349/109
6,004,685 A * 12/1999 Antoniadis ............ C09K 11/06
                                                    313/504
(Continued)

FOREIGN PATENT DOCUMENTS

CN    1033337594 A    10/2013
CN    104538423 A     4/2015

OTHER PUBLICATIONS

Biswas et al., "Simulations of emissions from microcavity tandem organic light-emitting diodes", Journal of Photonics for Energy, vol. 1, 2011 pp. 011016-1 to 11.*
(Continued)

*Primary Examiner* — Tom Thomas
*Assistant Examiner* — Vincent Wall
(74) *Attorney, Agent, or Firm* — Kilpatrick Townsend & Stockton LLP

(57) ABSTRACT

A pixel structure, a method for manufacturing the same and a display panel are provided. The pixel structure includes: a substrate, an anode layer, a first auxiliary light-emitting layer, a light-emitting layer, a cathode layer and at least one first resistive structure. The light-emitting layer at least includes a first light-emitting portion and a second light-emitting portion, where the first light-emitting portion corresponds to a first sub-pixel, the second light-emitting portion corresponds to a second sub-pixel and a turn-on voltage of the first sub-pixel is greater than that of the second sub-pixel. The at least one first resistive structure is arranged between the first auxiliary light-emitting layer and the cathode layer and arranged in a direction perpendicular to the second light-emitting portion, at least partially overlaps with the second light-emitting portion and does not overlap with the first light-emitting portion.

8 Claims, 11 Drawing Sheets

(51) Int. Cl.
    *H01L 51/00*    (2006.01)
    *H01L 51/50*    (2006.01)
    *H01L 51/56*    (2006.01)

(52) U.S. Cl.
    CPC ...... *H01L 51/5212* (2013.01); *H01L 51/5228* (2013.01); *H01L 51/56* (2013.01); *H01L 2251/301* (2013.01); *H01L 2251/303* (2013.01); *H01L 2251/558* (2013.01)

(56) References Cited

U.S. PATENT DOCUMENTS

| | | | |
|---|---|---|---|
| 9,087,964 B2* | 7/2015 | Hatano | H01L 33/36 |
| 2006/0078759 A1* | 4/2006 | Jeong | C09K 11/06 |
| | | | 428/690 |
| 2013/0134450 A1* | 5/2013 | Chang | H01L 51/5265 |
| | | | 257/88 |
| 2015/0028310 A1 | 1/2015 | Dai et al. | |

OTHER PUBLICATIONS

Photonics Polymer Lab, "Electron Transport materials for organic light-emitting diodes", 2009, pp. 1-33, https://mse.gist.ac.kr/~ppl/2004ppl/lecture/2009-02/2009_2nd_lecture_007.pdf.*

Lu et al., "Top emitting OLEDs with multilayered mirror consisting of metallic and dielectric layers", IEEE, 2006, pp. 188-191.*

\* cited by examiner

PIXEL STRUCTURE, METHOD FOR MANUFACTURE THE SAME AND DISPLAY PANEL

CROSS REFERENCE OF RELATED APPLICATION

The present application claims the priority to Chinese Patent Application No. 201511027979.2, titled "PIXEL STRUCTURE, METHOD FOR MANUFACTURE THE SAME AND DISPLAY PANEL", filed on Dec. 30, 2015 with the State Intellectual Property Office of the People's Republic of China, the content of which is incorporated herein by reference in its entirety.

FIELD

The present disclosure relates to the field of display technology, and particularly to a pixel structure, a method for manufacturing the pixel structure and a display panel including the pixel structure.

BACKGROUND

Currently, an OLED (Organic Light-Emitting Diode) display apparatus generally includes multiple sub-pixels, and lighting colors of adjacent sub-pixels are different. For example, an OLED display apparatus in conventional technology includes multiple red sub-pixels, green sub-pixels and blue sub-pixels which are periodically arranged, to realize the display of different colors.

As shown in FIG. 1, an OLED display apparatus in the conventional technology generally includes: a substrate 01; an anode layer 02 on a surface of the substrate 01, where the anode layer 02 consists of multiple anode portions; an auxiliary light-emitting layer 03, which is arranged on a surface of the anode layer 02 and covers the anode layer 02 and the substrate 01; a light-emitting layer 04 on a surface of the auxiliary light-emitting layer 03, where the light-emitting layer includes a red light-emitting portion 041, a green light-emitting portion 042 and a blue light-emitting portion 043, the light-emitting portions have a one-to-one correspondence with the anode portions, and the light-emitting portions of different colors correspond to sub-pixels of different colors, to realize the display of different colors; and a cathode layer 05 on a surface of the light-emitting layer 04.

However, there is a color crosstalk phenomenon when the above OLED display apparatus displays a pure color, that is, when the OLED display apparatus displays a pure red image, not only red but also a color of a sub-pixel adjacent to the red sub-pixel, such as green or blue, appear in the display image, which reduces a display quality of the OLED display apparatus.

SUMMARY

To solve the above-mentioned technical problem, a pixel structure, a method for manufacturing the pixel structure and a display panel including the pixel structure are provided according to embodiments of the present disclosure, so as to relieve the color crosstalk phenomenon for the display panel in displaying and improve a display quality of the display panel.

To solve the above-mentioned problem, the following technical solutions are provided according to the embodiments of the present disclosure.

A pixel structure is provided, which includes a substrate, an anode layer on a surface of the substrate, a first auxiliary light-emitting layer on a surface of the anode layer, a light-emitting layer on a surface of the first auxiliary light-emitting layer, a cathode layer on a surface of the light-emitting layer, at least one first resistive structure in a pathway between the first auxiliary light-emitting layer and the cathode layer, and/or any other components. The anode layer is completely covered by the first auxiliary light-emitting layer which is continuous. The light-emitting layer at least includes a first light-emitting portion and a second light-emitting portion. The first light-emitting portion corresponds to a first sub-pixel, the second light-emitting portion corresponds to a second sub-pixel and a turn-on voltage of the first sub-pixel is greater than that of the second sub-pixel. The light-emitting layer is covered by the cathode layer. The at least one first resistive structure is arranged in a direction perpendicular to the second light-emitting portion, at least partially overlaps with the second light-emitting portion and does not overlap with the first light-emitting portion, and an absolute value of a difference between a sum of resistances of the at least one first resistive structure and the second light-emitting portion and a resistance of the first light-emitting portion is less than a first predetermined value.

A method for manufacturing a pixel structure is provided, which is applied to the pixel structure above, and the method includes:

providing a substrate;

forming an anode layer on a surface of the substrate;

forming a first auxiliary light-emitting layer on a surface of the anode layer, where the anode layer is completely covered by the first auxiliary light-emitting layer which is continuous;

forming a light-emitting layer and at least one first resistive structure on a surface of the first auxiliary light-emitting layer, where the light-emitting layer at least includes a first light-emitting portion corresponding to a first sub-pixel and a second light-emitting portion corresponding to a second sub-pixel, a turn-on voltage of the first sub-pixel is greater than that of the second sub-pixel, the at least one first resistive structure is arranged in a direction perpendicular to the second light-emitting portion, at least partially overlaps with the second light-emitting portion and does not overlap with the first light-emitting portion, and an absolute value of a difference between a sum of resistances of the at least one first resistive structure and the second light-emitting portion and a resistance of the first light-emitting portion is less than a first predetermined value; and forming a cathode layer at a side of the light-emitting layer facing away from the first auxiliary light-emitting layer, where the light-emitting layer and the at least one first resistive structure are covered by the cathode layer.

A display panel including the above-described pixel structure is provided.

Compared with the conventional technology, the above-described technical solutions have the following advantages.

The pixel structure according to the embodiments of the present disclosure includes a substrate, an anode layer, a first auxiliary light-emitting layer, a light-emitting layer and a cathode layer, and further includes at least one first resistive structure. The light-emitting layer at least includes a first light-emitting portion and a second light-emitting portion, where the first light-emitting portion corresponds to a first sub-pixel, the second light-emitting portion corresponds to a second sub-pixel and a turn-on voltage of the first sub-pixel is greater than that of the second sub-pixel. The at least one first resistive structure is arranged in a pathway between the first auxiliary light-emitting layer and the cathode layer and arranged in a direction perpendicular to the second light-emitting portion, at least partially overlaps with the second light-emitting portion and does not overlap with the first light-emitting portion, and an absolute value of a difference between a sum of resistances of the at least one first resistive structure and the second light-emitting portion and a resistance of the first light-emitting portion is less than a first predetermined value, thereby increasing the turn-on voltage of the second sub-pixel. In this case, when the first sub-pixel is being displayed and the second sub-pixel is not being displayed, even though holes in a region of the first auxiliary light-emitting layer under the first light-emitting portion are transported to a region of the first auxiliary light-emitting layer under the second light-emitting portion through the first auxiliary light-emitting layer, forming a voltage difference between two ends of the second light-emitting portion, but the voltage difference is less than the turn-on voltage of the second sub-pixel, to ensure the second sub-pixel is not displayed when the first sub-pixel is being displayed, thereby relieving the color crosstalk phenomenon of the display panel in displaying and improving a display quality of the display panel.

BRIEF DESCRIPTION OF THE DRAWINGS

The drawings to be used in the descriptions of embodiments or conventional technology are described briefly as follows, so that technical solutions according to the embodiments of the disclosure or according to the conventional technology may become clearer. Apparently, the drawings in the following descriptions only illustrate some embodiments of the disclosure. For those in the art, other drawings may be obtained based on these drawings without any creative work.

FIG. 15 is a top view of the arrangement of light-emitting portions in a pixel structure according to an embodiment of the disclosure;

FIG. 16 is a top view of the arrangement of light-emitting portions in a pixel structure according to an embodiment of the disclosure;

DETAILED DESCRIPTION

As described in the background, there is a color crosstalk phenomenon when an OLED display apparatus in the conventional technology displays a pure color, that is, when the OLED display apparatus displays a pure red image, not only red but also a color of a sub-pixel adjacent to the red sub-pixel, such as green or blue, appear in the display image, which reduces a display quality of the OLED display apparatus.

Figure 1:
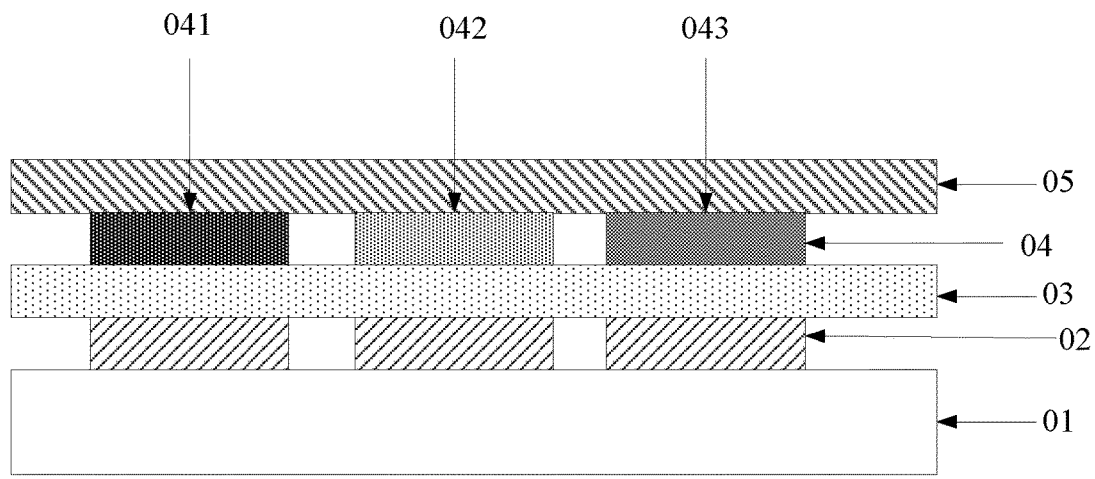
FIG. 1 is a schematic structural diagram of a display apparatus in the conventional technology.
Figure 2:
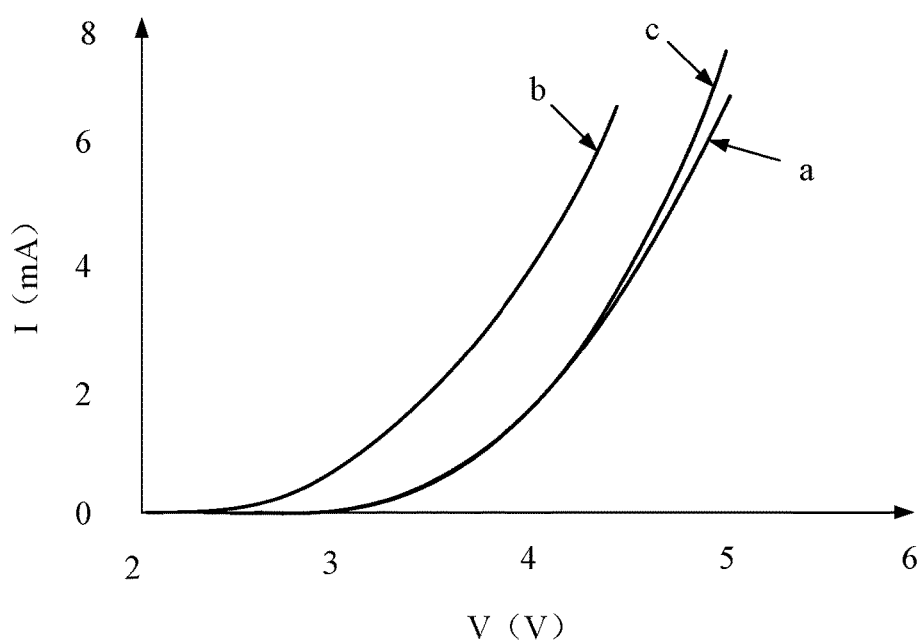
FIG. 2 is a schematic diagram of current-voltage curves of a red sub-pixel, a blue sub-pixel and a green sub-pixel in a display apparatus in the conventional technology.

The inventor finds out through researches that, this is because the auxiliary light-emitting layer 03 corresponding to the light-emitting portions of the light-emitting layer is an integral auxiliary light-emitting layer. When the red sub-pixel is being displayed and the green sub-pixel is not being displayed, holes in a region of the auxiliary light-emitting layer 03 under the red light-emitting portion 041 are transported to a region of the auxiliary light-emitting layer 03 under the green light-emitting portion 042 through the auxiliary light-emitting layer 03, forming a voltage difference between two ends of the green light-emitting portion. As shown in FIG. 2, a curve a is a current-voltage curve of the red sub-pixel, a curve b is a current-voltage curve of the green sub-pixel and a curve c is a current-voltage curve of the blue sub-pixel. As can be seen from FIG. 2, a turn-on voltage of the green sub-pixel corresponding to the green light-emitting portion 042 is less than a turn-on voltage of the red sub-pixel corresponding to the red light-emitting portion 041. In this case, when the red sub-pixel is being displayed and the green sub-pixel is not being displayed, holes in a region under the red light-emitting portion 041 are transported to a region under the green light-emitting portion 042 through the auxiliary light-emitting layer 03, which causes a voltage difference between the region of the auxiliary light-emitting layer under the green light-emitting portion 042 and a cathode above the green light-emitting portion 042 to be greater than the turn-on voltage of the green sub-pixel. Therefore, the green sub-pixel is displayed as well such that the green sub-pixel may be displayed before the red sub-pixel is displayed, thereby resulting in a color crosstalk phenomenon.

In view of above, a pixel structure and a display panel including the pixel structure are provided according to embodiments of the present disclosure. The pixel structure includes a substrate, an anode layer, a first auxiliary light-emitting layer, a light-emitting layer and a cathode layer, and further includes at least one first resistive structure. The light-emitting layer at least includes a first light-emitting portion and a second light-emitting portion, and the at least one first resistive structure is arranged in a pathway between the first auxiliary light-emitting layer and the cathode layer and arranged in a direction perpendicular to the second light-emitting portion, thereby increasing a turn-on voltage of the second sub-pixel. In this case, it is ensured that the second sub-pixel is not displayed, thereby relieving the color crosstalk phenomenon of the display panel in displaying and improving a display quality of the display panel.

Technical solutions according to the embodiments of the disclosure are described clearly and completely hereinafter in conjunction with the drawings. Apparently, the described embodiments are only a few rather than all of the embodiments of the disclosure. Any other embodiments obtained by those skilled in the art based on the embodiments in the present disclosure without any creative work fall in the scope of the disclosure.

Details are included in the following descriptions for better understanding the disclosure, while the disclosure may as well be implemented in other ways other than what is described herein. Those skilled in the art may make extensions without deviating from the essence of the disclosure, and thus the disclosure is not limited to the specific embodiments disclosed hereinafter.

Figure 3:
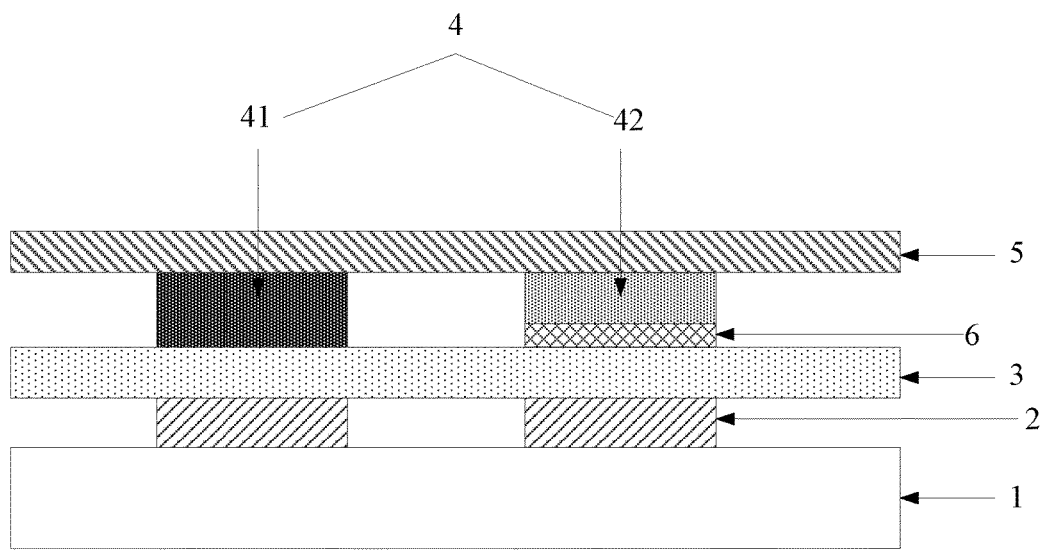
FIG. 3 is a schematic structural diagram of a pixel structure according to an embodiment of the disclosure.

A pixel structure is provided according to an embodiment of the disclosure. As shown in FIG. 3, the pixel structure includes:

a substrate 1;

an anode layer 2 on a surface of the substrate;

a first auxiliary light-emitting layer 3 on a surface of the anode layer 2, where the anode layer 2 is completely covered by the first auxiliary light-emitting layer 3 which is continuous;

a light-emitting layer 4 on a surface of the first auxiliary light-emitting layer 3, where the light-emitting layer 4 at least includes a first light-emitting portion 41 and a second light-emitting portion 42, the first light-emitting portion 41 corresponds to a first sub-pixel, the second light-emitting portion 42 corresponds to a second sub-pixel and a turn-o voltage of the first sub-pixel is greater than that of the second sub-pixel;

a cathode layer 5 on a surface of the light-emitting layer 4, where the light-emitting layer 4 is covered by the cathode layer 5; and at least one first resistive structure 6 in a pathway between the first auxiliary light-emitting layer 3 and the cathode layer 5, where the first resistive structure is arranged in a direction perpendicular to the second light-emitting portion 42, at least partially overlaps with the second light-emitting portion 42 and does not overlap with the first light-emitting portion 41, and an absolute value of a difference between a sum of resistances of the at least one first resistive structure 6 and the second light-emitting portion 42 and a resistance of the first light-emitting portion 41 is less than a first predetermined value.

It should be noted that, in the embodiment of the disclosure, the first auxiliary light-emitting layer 3 may be a hole transportation layer, a hole injection layer or a buffer layer, which is not limited in the disclosure, as long as the first auxiliary light-emitting layer 3 can transport holes.

As seen from the above, the at least one first resistive structure 6 is added to the second sub-pixel in the pixel structure according to the embodiment of the disclosure, to increase a resistance of the second sub-pixel, thereby increasing the turn-on voltage of the second sub-pixel. In this case, when the first sub-pixel is being displayed and the second sub-pixel is not being displayed, even through holes in a region of the first auxiliary light-emitting layer 3 under the first light-emitting portion 41 are transported to a region of the first auxiliary light-emitting layer 3 under the second light-emitting portion 42, forming a voltage difference between two end of the second light-emitting portion 42, but the voltage difference is less than the turn-on voltage of the second sub-pixel, to ensure the second sub-pixel is not displayed, thereby relieving the color crosstalk phenomenon between the first sub-pixel and the second sub-pixel when the display panel displays an image, and improving a display quality of the display panel.

Figure 4:
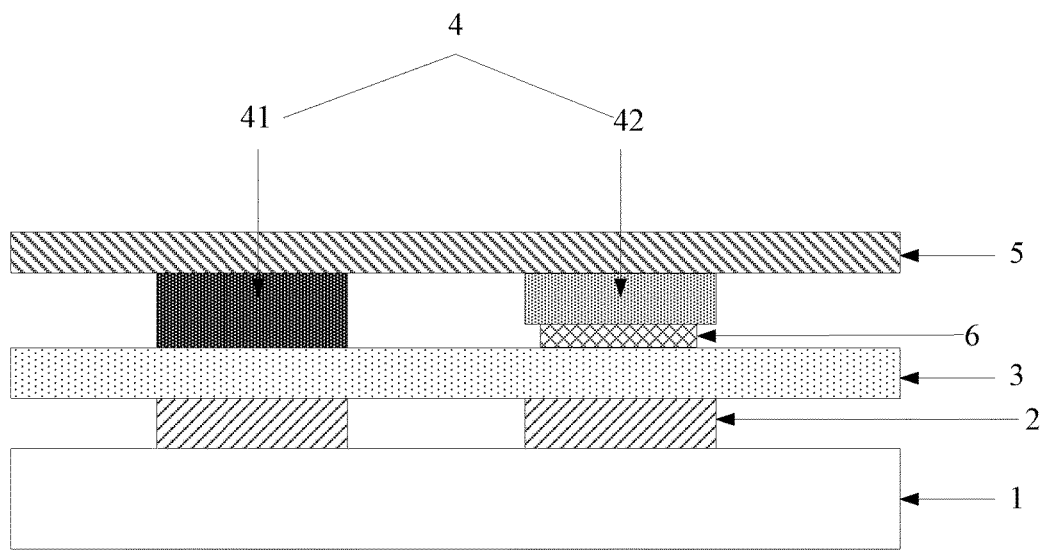
FIG. 4 is a schematic structural diagram of a pixel structure according to an embodiment of the disclosure.
Figure 5:
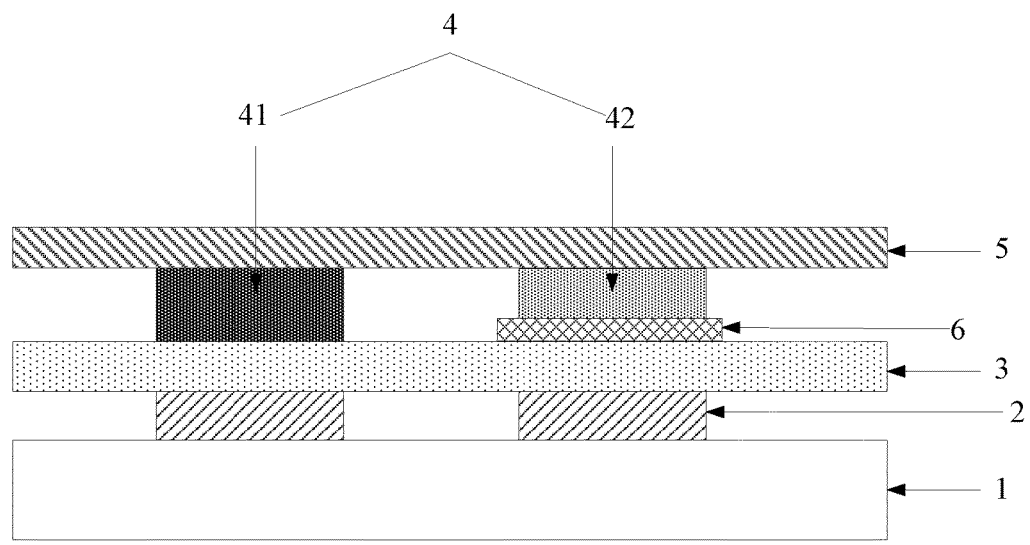
FIG. 5 is a schematic structural diagram of a pixel structure according to an embodiment of the disclosure.

Based on the embodiment above, an orthographic projection of the at least one first resistive structure 6 on the substrate 1 is completely covered by an orthographic projection of the second light-emitting portion 42 on the substrate 1, as shown in FIG. 4. In another embodiment of the disclosure, an orthographic projection of the second light-emitting portion 42 on the substrate 1 is completely covered by an orthographic projection of the at least one first resistive structure 6 on the substrate 1. Preferably, an orthographic projection of the at least one first resistive structure 6 on the substrate 1 exactly overlaps with an orthographic projection of the second light-emitting portion 42 on the substrate 1, as shown in FIG. 3, which is not limited in the disclosure, as long as the at least one first resistive structure 6 is arranged in a direction perpendicular to the second light-emitting portion 42, at least partially overlaps with the second light-emitting portion 42 and does not overlap with the first light-emitting portion 41.

Figure 6:
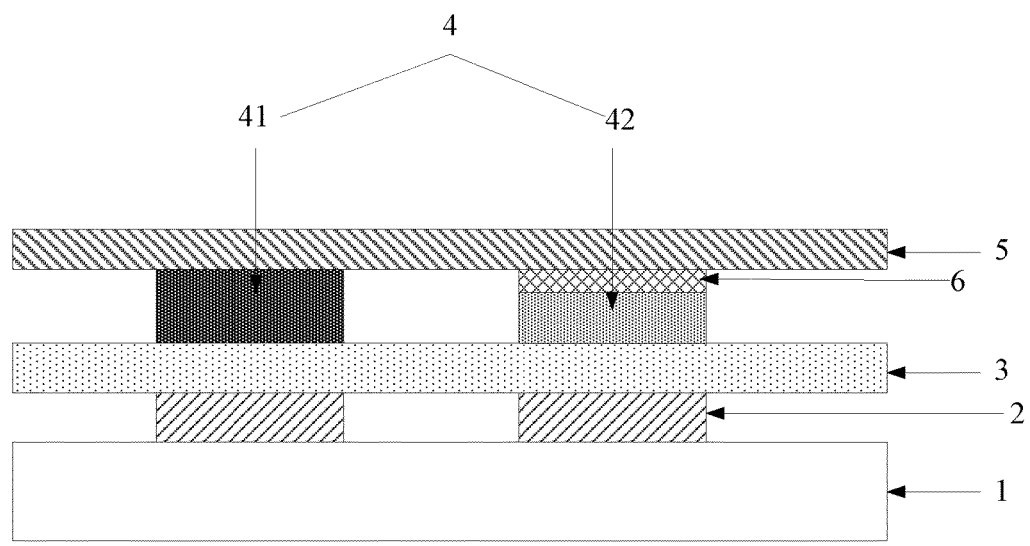
FIG. 6 is a schematic structural diagram of a pixel structure according to an embodiment of the disclosure.

Based on any of the embodiments above, in an embodiment of the disclosure, the at least one first resistive structure 6 is arranged between the first auxiliary light-emitting layer 3 and the light-emitting layer 4, as shown in FIGS. 1 to 5. In another embodiment of the disclosure, the at least one first resistive structure 6 is arranged between the light-emitting layer 4 and the cathode layer 5, as shown in FIG. 6, which is not limited in the disclosure, as long as the at least one first resistive structure 6 is arranged in the pathway between the first auxiliary light-emitting layer 3 and the cathode layer 5.

Figure 7:
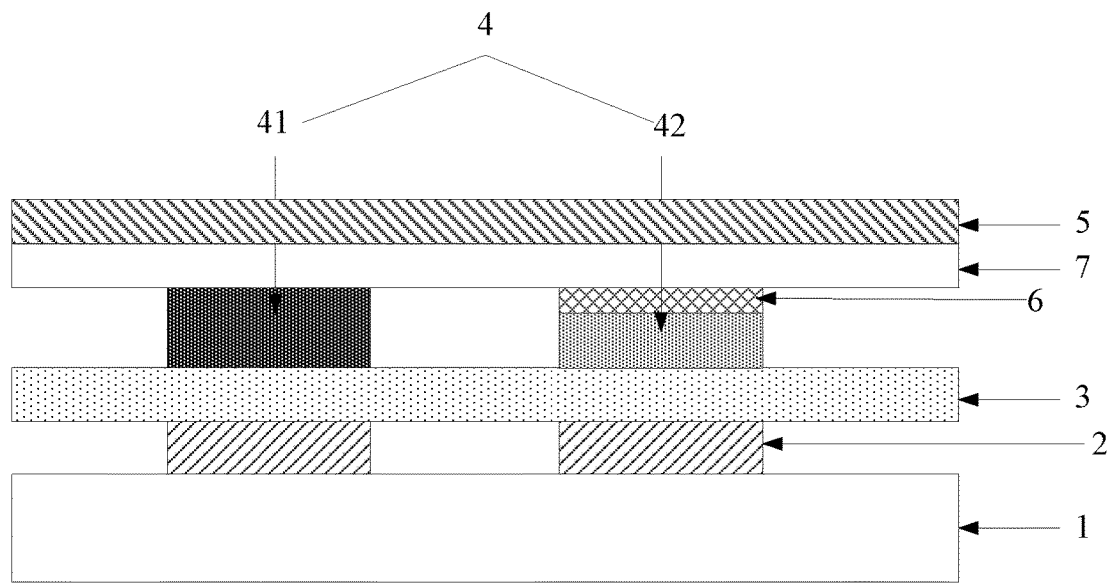
FIG. 7 is a schematic structural diagram of a pixel structure according to an embodiment of the disclosure.
Figure 8:
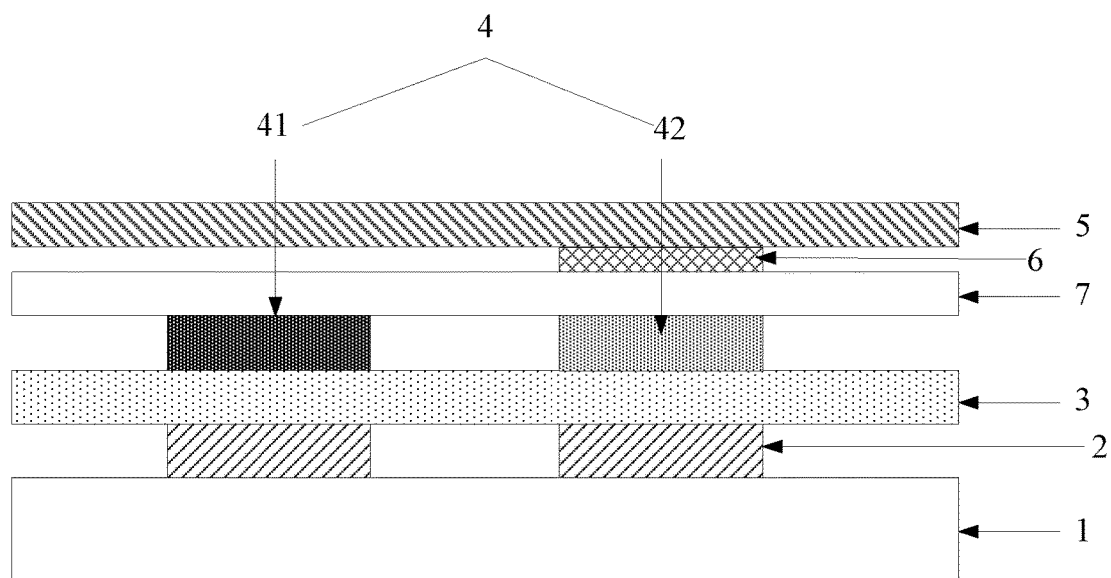
FIG. 8 is a schematic structural diagram of a pixel structure according to an embodiment of the disclosure.

Based on the embodiment above, a second auxiliary light-emitting layer 7 is arranged between the cathode layer 5 and the light-emitting layer 4, as shown in FIG. 7. In one embodiment, in a case that the at least one first resistive structure 6 is arranged between the light-emitting layer 4 and the cathode layer 5, the at least one first resistive structure 6 may be arranged between the light-emitting layer 4 and the second auxiliary light-emitting layer 7, as shown in FIG. 7, or may be arranged between the second auxiliary light-emitting layer 7 and the cathode layer 5, as shown in FIG. 8, as the case may be, which is not limited in the disclosure.

Figure 9:
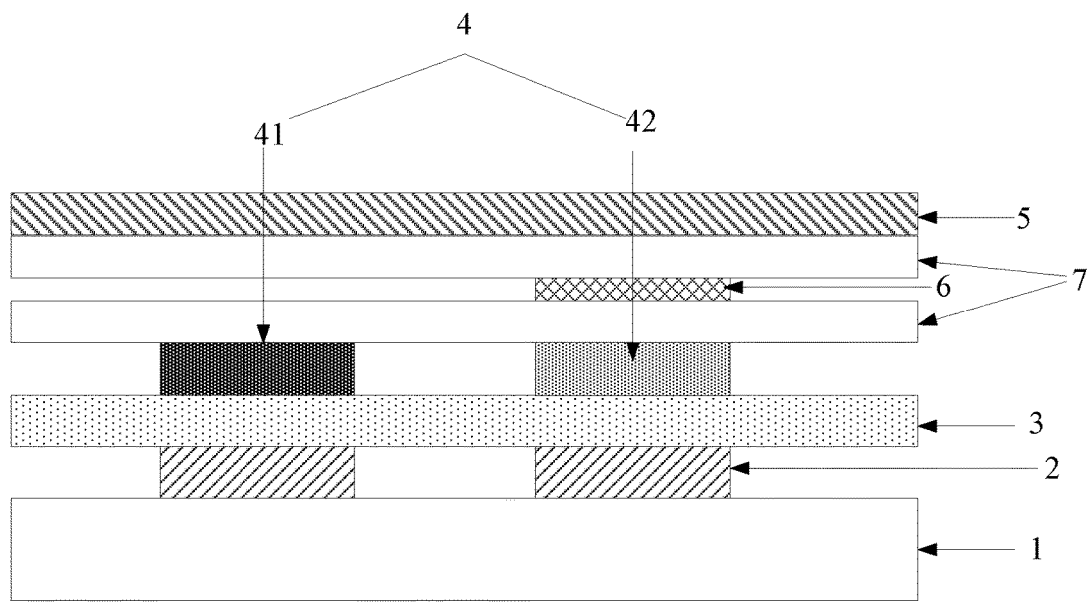
FIG. 9 is a schematic structural diagram of a pixel structure according to an embodiment of the disclosure.

It should be noted that, in the embodiment above, the second auxiliary light-emitting layer 7 may be of a single layer structure or a multilayer stacked structure. In a case that the second auxiliary light-emitting layer 7 is of the multilayer stacked structure, that is, the second auxiliary light-emitting layer 7 includes multiple stacked second auxiliary light-emitting sub-layers, the at least one first resistive structure 6 may be arranged between any two adjacent second auxiliary light-emitting sub-layers, as shown in FIG. 9.

Figure 10:
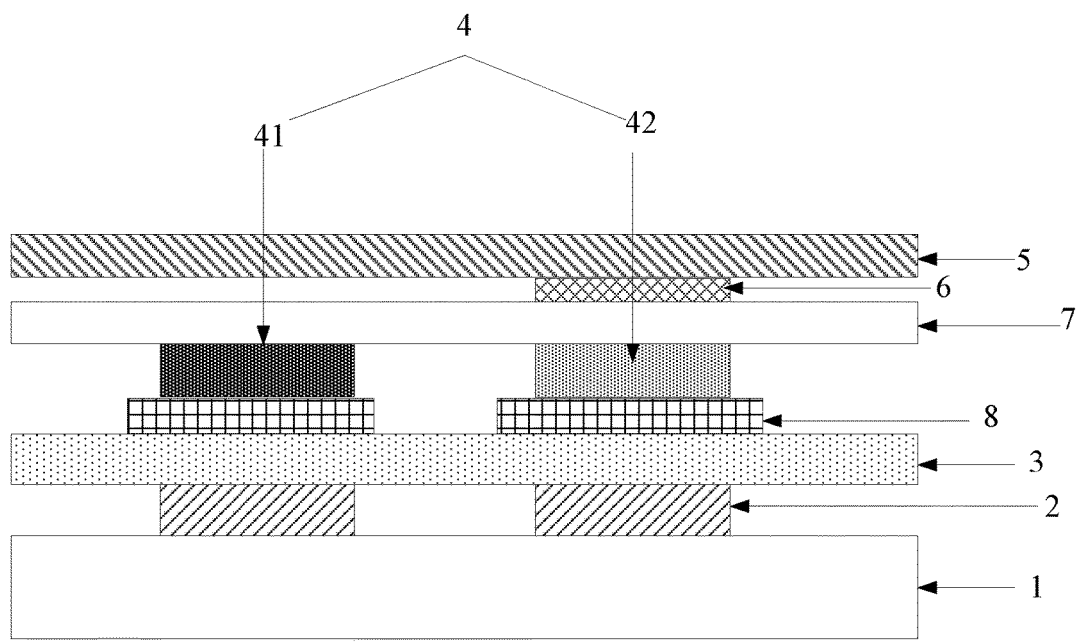
FIG. 10 is a schematic structural diagram of a pixel structure according to an embodiment of the disclosure.

Based on any of the embodiments above, at least one third auxiliary light-emitting layer 8 is arranged between the first auxiliary light-emitting layer 3 and the light-emitting layer 4. At least one of the at least one third auxiliary light-emitting layer 8 includes multiple discontinuous auxiliary light-emitting portions, the first light-emitting portion 41 is covered by a part of the multiple auxiliary light-emitting portions and the second light-emitting portion 42 is covered by a part of the multiple auxiliary light-emitting portions, as shown in FIG. 10. It should be noted that, in the embodiment of the disclosure, the third auxiliary light-emitting layer may be a hole transportation layer, a hole injection layer or a buffer layer, as the case may be, which is not limited in the disclosure.

Figure 11:
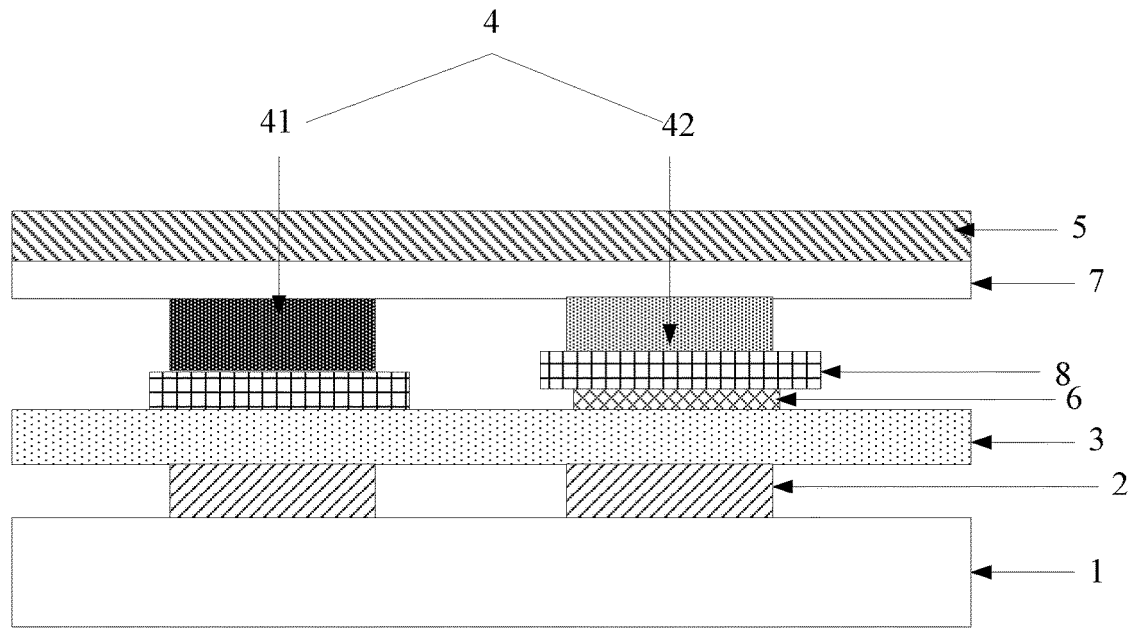
FIG. 11 is a schematic structural diagram of a pixel structure according to an embodiment of the disclosure.
Figure 12:
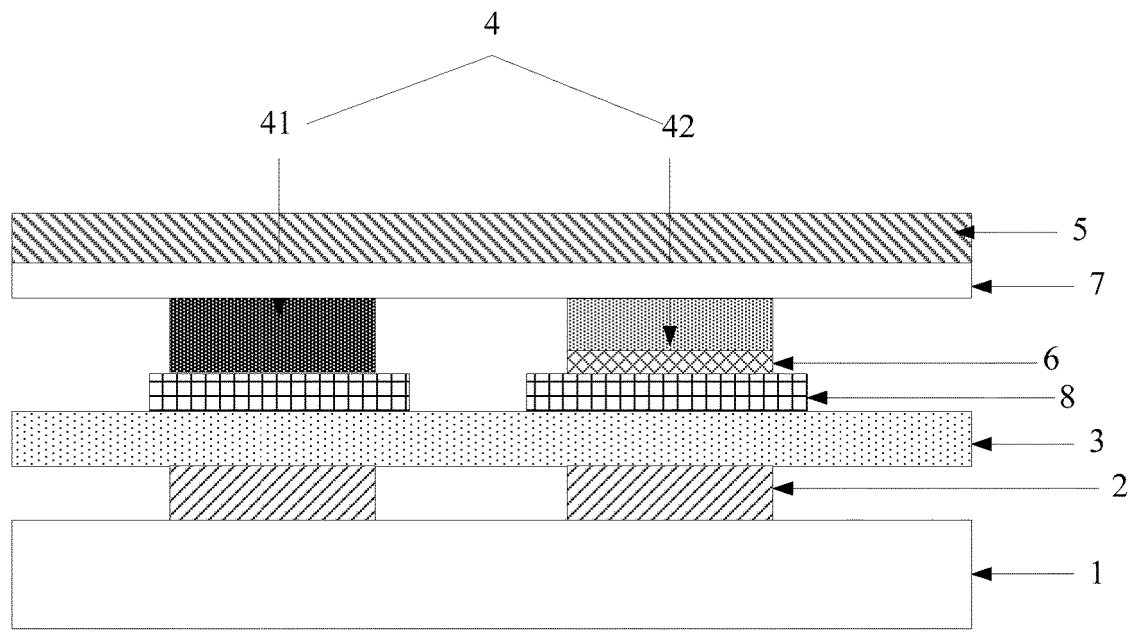
FIG. 12 is a schematic structural diagram of a pixel structure according to an embodiment of the disclosure.

Based on the embodiment above, in a case that the at least one first resistive structure 6 is arranged between the first auxiliary light-emitting layer 3 and the light-emitting layer 4, the at least one first resistive structure 6 may be arranged between the first auxiliary light-emitting layer 3 and the at least one third auxiliary light-emitting layer 8, as shown in FIG. 11. Alternatively, the at least one first resistive structure 6 may be arranged between the at least one third auxiliary light-emitting layer 8 and the light-emitting layer 4, as shown in FIG. 12, as the case may be, which is not limited in the disclosure.

Based on the embodiment above, multiple third auxiliary light-emitting layers 8 can be arranged between the first auxiliary light-emitting layer 3 and the light-emitting layer 4. In the embodiment, the at least one first resistive structure 6 may be arranged between any two adjacent multiple third auxiliary light-emitting layers 8, as the case may be, which is not limited in the disclosure.

It should be noted that, based on any of the embodiments above, the pixel structure may include multiple first resistive structures 6. In a case that the pixel structure includes multiple first resistive structures 6, different first resistive structures 6 may be arranged between completely same two layers or arranged between incompletely same two layers, as the case may be, which is not limited in the disclosure.

Based on any of the embodiments above, in a preferred embodiment of the disclosure, the first predetermined value is less than or equal to a difference between the resistance of the second light-emitting portion 42 and the resistance of the first light-emitting portion 41. Preferably, the first predetermined value is equal to a difference between the resistance of the second light-emitting portion 42 and the resistance of the first light-emitting portion 41, in this case, the turn-on voltage of the first sub-pixel is equal to the turn-on voltage of the second sub-pixel to maximally relieve the color crosstalk phenomenon of the pixel structure in operation and improve a display quality of the pixel structure.

Based on any of the embodiments above, the at least one first resistive structure 6 may be made of an organic conductive material or an inorganic conductive material. However it should be understood that the type of material that the first structure 6 can be made of is not limited to those materials. The type of material that the first structure 6 can be made of any material is a conductive material and has some resistance. In a case that the at least one first resistive structure 6 is made of an inorganic conductive material, the inorganic material may be selected from a group consisting of aluminum, silver, molybdenum or corresponding oxides such as aluminum oxide, silver oxide or molybdenum oxide, as the case may be, which is not limited in the disclosure.

Based on the embodiment above, the at least one first resistive structure 6 has a thickness in a range from 5 nm to 30 nm, inclusive, which is not limited in the disclosure and depends on a resistivity of the at least one first resistive structure 6.

Based on any of the embodiment above, in an embodiment of the disclosure, the first light-emitting portion 41 is a red light-emitting portion and the second light-emitting portion 42 is a green light-emitting portion. In another embodiment of the disclosure, the first light-emitting portion 41 is a blue light-emitting portion and the second light-emitting portion 42 is a green light-emitting portion. In other embodiments of the disclosure, the first light-emitting portion 41 and the second light-emitting portion 42 may be light-emitting portions of other colors, which is not limited in the disclosure, as long as a turn-on voltage of a sub-pixel corresponding to the first light-emitting portion 41 is greater than that of a sub-pixel corresponding to the second light-emitting portion 42.

Figure 13:
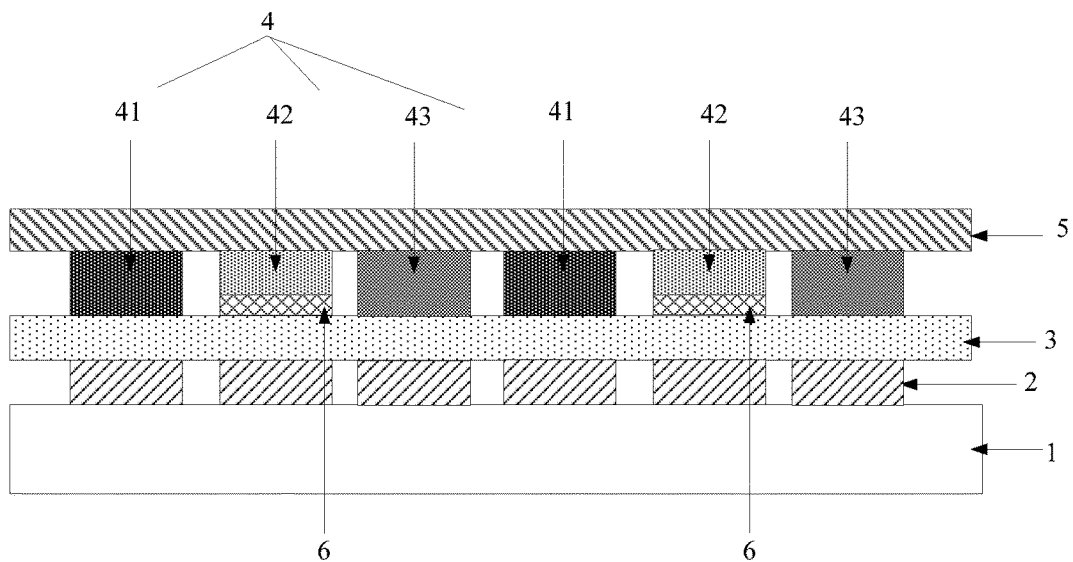
FIG. 13 is a schematic structural diagram of a pixel structure according to an embodiment of the disclosure.

Based on any of the embodiments above, as shown in FIG. 13, the light-emitting layer 4 further includes a third light-emitting portion 43, the third light-emitting portion 43 corresponds to a third sub-pixel, and a turn-on voltage of the third sub-pixel is greater than that of the second sub-pixel and is not greater than the turn-on voltage of the first sub-pixel.

Figure 14:
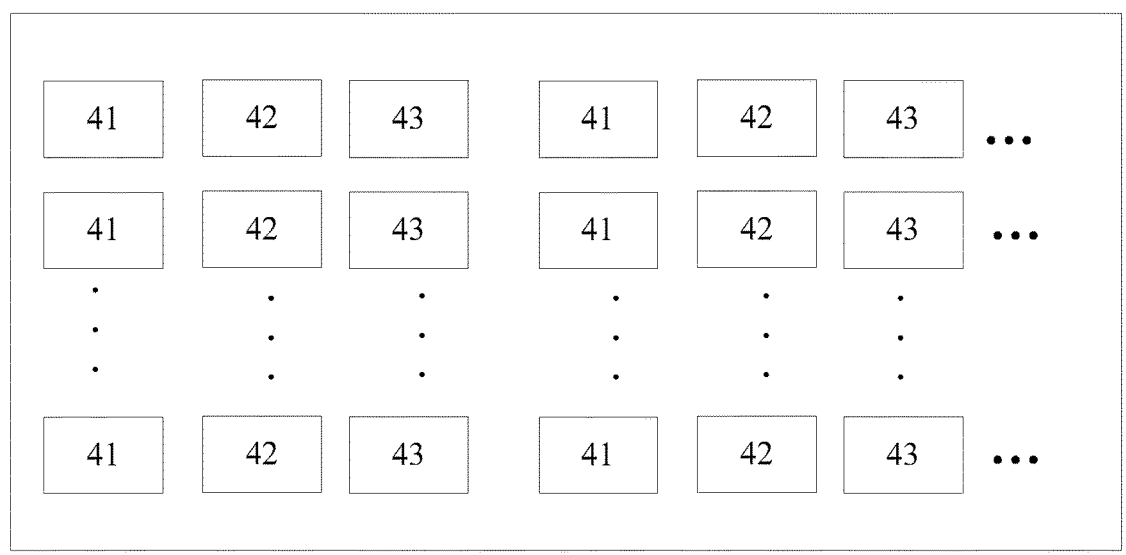
FIG. 14 is a top view of the arrangement of light-emitting portions in a pixel structure according to an embodiment of the disclosure.
Figures 15, 16:
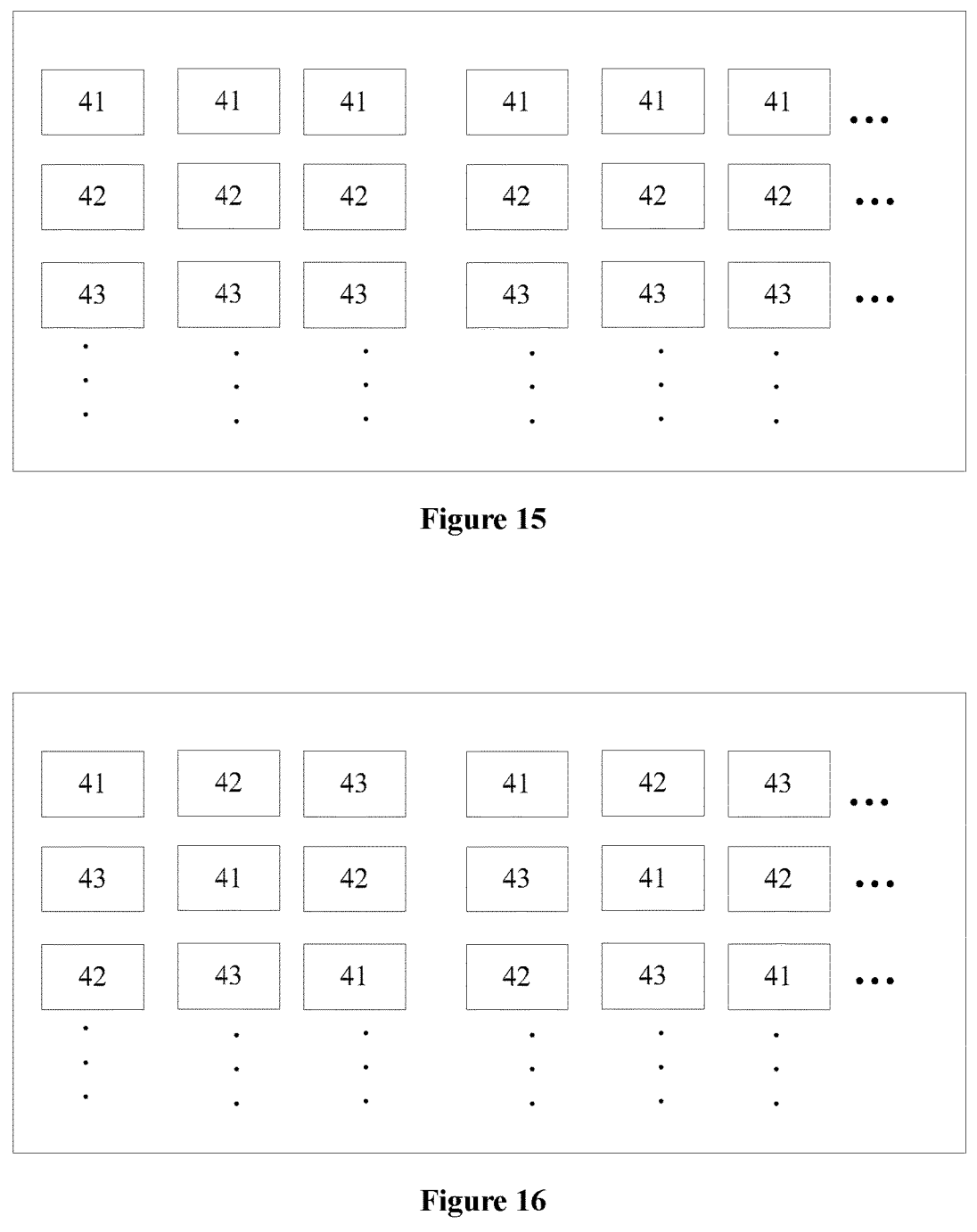

Based on the embodiment above, the pixel structure includes multiple first light-emitting portions, multiple second light-emitting portions and multiple third light-emitting portions. The multiple first light-emitting portions, the multiple second light-emitting portions, the multiple third light-emitting portions are arranged periodically along a predetermined direction. It should be noted that, in the embodiment of the disclosure, the predetermined direction may be a row direction, as shown in FIG. 14, may be a column direction, as shown in FIG. 15, or may include both a row direction and a column direction, as shown in FIG. 16, as the case may be, which is not limited in the disclosure.

Based on the embodiment above, a turn-on voltage of the third sub-pixel can be less than that of the first sub-pixel. In the embodiment, in a case that the first sub-pixel corresponding to the first light-emitting portion and the third sub-pixel corresponding to the third light-emitting portion are adjacent, there may be a color crosstalk phenomenon between the first sub-pixel and the third sub-pixel.

Figure 17:
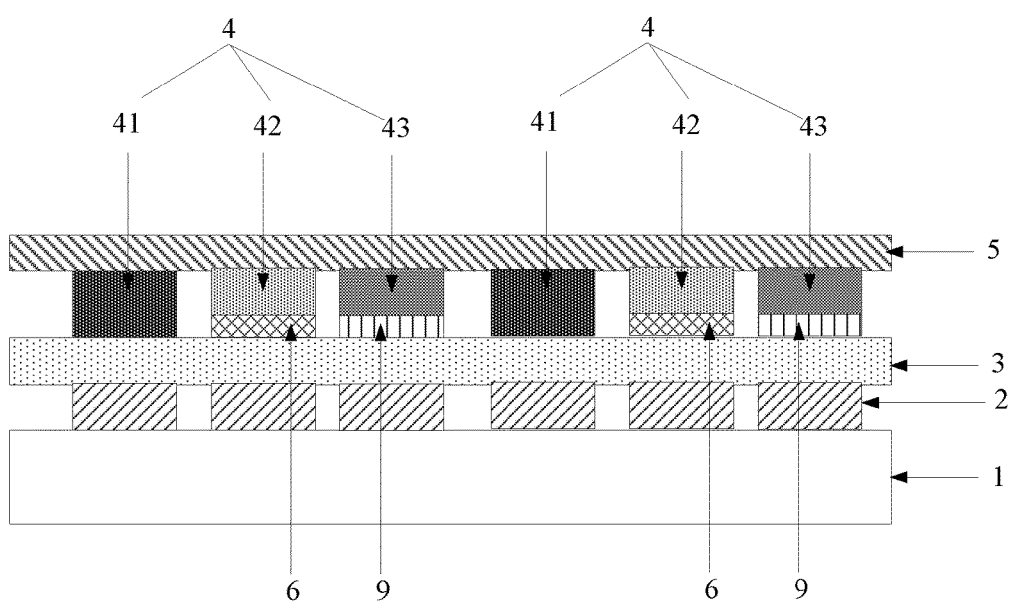
FIG. 17 is a schematic structural diagram of a pixel structure according to an embodiment of the disclosure.

Thus, based on the embodiment above, in a preferred embodiment of the disclosure, as shown in FIG. 17, the pixel structure further includes: at least one second resistive structure 9 in the pathway between the first auxiliary light-emitting layer 3 and the cathode layer 5, the second resistive structure 9 is arranged in a direction perpendicular to the third light-emitting portion 43, at least partially overlaps with the third light-emitting portion 43 and does not overlap with the first light-emitting portions 41 or the second light-emitting portion 42, and an absolute value of a difference between a sum of resistances of the third light-emitting portion 43 and the at least one second resistive structure 9 and the resistance of the first light-emitting portion 41 is less than a second predetermined value.

The at least one second resistive structure 9 is added to the third sub-pixel in the pixel structure according to the embodiment of the disclosure, to increase a resistance of the third sub-pixel, thereby increasing the turn-on voltage of the third sub-pixel. In this case, when the first sub-pixel is being displayed and the third sub-pixel is not being displayed, even through holes in a region of the first auxiliary light-emitting layer 3 under the first light-emitting portion 41 are transported to a region of the first auxiliary light-emitting layer 3 under the third light-emitting portion 43, forming a voltage difference between two ends of the third light-emitting portion 43, but the voltage difference is less than the turn-on voltage of the third sub-pixel, to ensure the third sub-pixel is not displayed, thereby relieving the color crosstalk phenomenon between the first sub-pixel and the third sub-pixel when the display panel displays an image, and improving a display quality of the display panel.

Based on the embodiment above, the second predetermined value can be less than or equal to a difference between the resistance of the third light-emitting portion 43 and that of the first light-emitting portion 41.

Preferably, the second predetermined value is equal to a difference between the resistance of the third light-emitting portion 43 and the resistance of the first light-emitting portion 41. In this case, the turn-on voltage of the first sub-pixel is equal to the turn-on voltage of the third sub-pixel to maximally relieve the color crosstalk phenomenon between the first sub-pixel and the third sub-pixel of the pixel structure in operation and improve a display quality of the pixel structure.

Similarly, in a case that the second sub-pixel corresponding to the second light-emitting portion and the third sub-pixel corresponding to the third light-emitting portion are adjacent, there may be a color crosstalk phenomenon between the second sub-pixel and the third sub-pixel. Based on the embodiment above, a sum of resistances of the second light-emitting portion and the at least one first resistive structure is less than a resistance of the first light-emitting portion, and a sum of resistances of the third light-emitting portion and the at least one second resistive structure is less than the resistance of the first light-emitting portion. In this case, a difference between the turn-on voltage of the second sub-pixel and the turn-on voltage of the third sub-pixel is reduced while a difference between the turn-on voltage of the first sub-pixel and the turn-on voltage of the second sub-pixel and a difference between the turn-on voltage of the first sub-pixel and the turn-on voltage of the third sub-pixel are reduced, thereby relieving the color crosstalk phenomenon between the second sub-pixel and the third sub-pixel which are adjacent when the display panel displays an image, and improving a display quality of the display panel.

Based on the embodiment above, the first predetermined value can be equal to the difference between the resistance of the second light-emitting portion 42 and the resistance of the first light-emitting portion 41, and the second predetermined value is equal to the difference between the resistance of the third light-emitting portion 43 and the resistance of the first light-emitting portion 41. In this case, the turn-on voltage of the first sub-pixel is equal to the turn-on voltage of the second sub-pixel and the turn-on voltage of the first sub-pixel is equal to the turn-on voltage of the third sub-pixel. That is, the turn-on voltages of the first sub-pixel, the second sub-pixel and the third sub-pixel are same or basically same, thereby maximally relieving the color crosstalk phenomenon between adjacent sub-pixels of the pixel structure in operation and improving a display quality of the pixel structure.

Based on the embodiment above, an orthographic projection of the at least one second resistive structure 9 on the substrate 1 can be completely covered by an orthographic projection of the third light-emitting portion 43 on the substrate 1. In another embodiment of the disclosure, an orthographic projection of the third light-emitting portion 43 on the substrate 1 is completely covered by an orthographic projection of the at least one second resistive structure 9 on the substrate 1. Preferably, an orthographic projection of the at least one second resistive structure 9 on the substrate 1 exactly overlaps with an orthographic projection of the third light-emitting portion 43 on the substrate. However, this is not intended to be limiting. The at least one second resistive structure 9 can be however arranged so long as it is arranged in any direction perpendicular to the third light-emitting portion 43, at least partially overlaps with the third light-emitting portion 43 and does not overlap with the first light-emitting portion 41 or the second light-emitting portion 42.

Based on any of the embodiments above, in an embodiment of the disclosure, the at least one second resistive structure 9 can be arranged between the first auxiliary light-emitting layer 3 and the light-emitting layer 4. In another embodiment of the disclosure, the at least one second resistive structure 9 is arranged between the light-emitting layer 4 and the cathode layer 5. However, it is not intended to be limiting, as long as the at least one second resistive structure 9 is arranged in the pathway between the first auxiliary light-emitting layer 3 and the cathode layer 5.

Based on the embodiment above, in a case that a second auxiliary light-emitting layer 7 is arranged between the cathode layer 5 an the light-emitting layer 4 and the at least one second resistive structure 9 is arranged between the light-emitting layer 4 and the cathode layer 5, the at least one second resistive structure 9 may be arranged between the light-emitting layer 4 and the second auxiliary light-emitting layer 7. Alternatively, the at least one second resistive structure 9 may be arranged between the second auxiliary light-emitting layer 7 and the cathode layer 5, as the case may be, which is not limited in the disclosure.

It should be noted that, in the embodiment above, the second auxiliary light-emitting layer 7 may be of a single layer structure or a multilayer stacked structure. In a case that the second auxiliary light-emitting layer 7 is of the multilayer stacked structure, that is, the second auxiliary light-emitting layer 7 includes multiple stacked second auxiliary light-emitting sub-layers, the at least one second resistive structure 9 may be arranged between any two adjacent second auxiliary light-emitting sub-layers.

Based on any of the embodiments above, at least one third auxiliary light-emitting layer 8 can be arranged between the first auxiliary light-emitting layer 3 and the light-emitting layer 4. At least one of the at least one third auxiliary light-emitting layer 8 includes multiple discontinuous auxiliary light-emitting portions, the first light-emitting portion 41 is covered by a part of the multiple auxiliary light-emitting portions, the second light-emitting portion 42 is covered by a part of the multiple auxiliary light-emitting portions and the third light-emitting portion 43 is covered by a part of the multiple auxiliary light-emitting portions.

Based on the embodiment above, in a case that the at least one second resistive structure 9 can be arranged between the first auxiliary light-emitting layer 3 and the light-emitting layer 4, the at least one second resistive structure 9 may be arranged between the first auxiliary light-emitting layer 3 and the at least one third auxiliary light-emitting layer 8. Alternatively, the at least one second resistive structure 9 may be arranged between the at least one auxiliary light-emitting layer 8 and the light-emitting layer 4, as the case may be, which is not limited in the disclosure.

Based on the embodiment above, multiple third auxiliary light-emitting layers 8 can be arranged between the first auxiliary light-emitting layer 3 and the light-emitting layer 4. In one embodiment, the at least one second resistive structure 9 may be arranged between any two adjacent multiple third auxiliary light-emitting layers 8, as the case may be, which is not limited in the disclosure.

It should be noted that, based on any of the embodiments above, the pixel structure may include multiple second resistive structures 9. In a case that the pixel structure includes multiple second resistive structures 9, different second resistive structures 9 may be arranged between completely same two layers or between incompletely same two layers, as the case may be, which is not limited in the disclosure.

It should also be noted that, in any of the embodiments above, the at least one second resistive structure 9 and the at least one first resistive structure 6 may be arranged between completely same two layers or between incompletely same two layers, as the case may be, which is not limited in the disclosure.

Based on any of the embodiments above, the at least one second resistive structure 9 may be made of an organic conductive material or an inorganic conductive material. However, this is not intended to be limiting. The at least one second resistive structure 9 can be made of any material that is a conductive material and has some resistance. In a case that the at least one second resistive structure 9 is made of an inorganic conductive material, the inorganic material may be selected from a group consisting of aluminum, silver, molybdenum or corresponding oxides such as aluminum oxide, silver oxide or molybdenum oxide, as the case may be, which is not limited in the disclosure.

Based on any of the embodiment above, the first light-emitting portion 41 can be a red light-emitting portion, the second light-emitting portion 42 can be a green light-emitting portion and the third light-emitting portion 43 can be a blue light-emitting portion, as the case may be, which is not limited in the disclosure.

It should be noted that, in any of the embodiments above, the pixel structure according to the embodiments of the disclosure is described with an example that the pixel structure includes three sub-pixels of the first sub-pixel, the second sub-pixel and the third sub-pixel in the present disclosure, which is not limited in the disclosure. In other embodiments of the disclosure, the pixel structure may further include other sub-pixels and accordingly, the pixel structure may further include light-emitting portions corresponding to the other sub-pixels, as the case may be.

Figure 20:
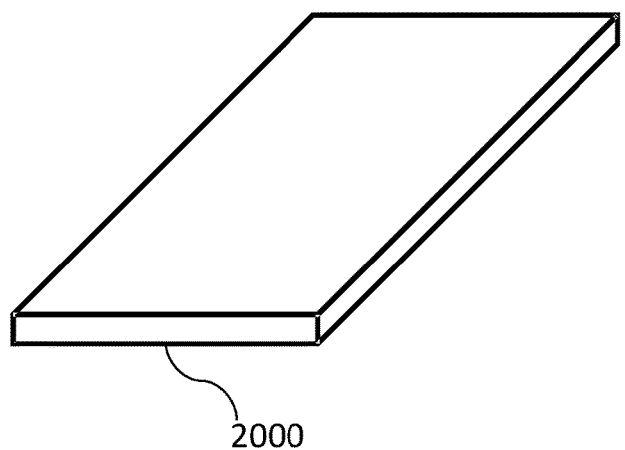
FIG. 20 is a schematic structural diagram of a display plane according to an embodiment of the disclosure.

Accordingly, a display panel 2000 as shown in FIG. 20 is further provided according to an embodiment of the present disclosure, and the display panel 2000 includes the pixel structure according to any one of the embodiments above.

In summary, in the pixel structure and the display panel according to the embodiments of the present disclosure, at least one first resistive structure 6 is arranged in the pathway between the first auxiliary light-emitting layer 3 and the cathode layer 5 and arranged in the direction perpendicular to the second light-emitting portion 42, to adjust the resistance of the second sub-pixel corresponding to the second light-emitting portion 42 through the at least one first resistive structure 6, thereby increasing the turn-on voltage of the second sub-pixel. In this case, the turn-on voltages of the second sub-pixel and the first sub-pixel are basically same, to relieve the color crosstalk phenomenon between the first sub-pixel and the second sub-pixel when the display panel displays an image and improve the display quality of the display panel.

Moreover, in a case that the pixel structure and the display panel including the pixel structure include a third light-emitting portion 43 and the turn-on voltage of the third sub-pixel corresponding to the third light-emitting portion 43 is different from the turn-on voltage of the sub-pixel corresponding to the first light-emitting portion 41, at least one second resistive structure 9 may be arranged in the pathway between the first auxiliary light-emitting layer 3 and the cathode layer 5. In that situation, the at least one second resistive structure 9 may also be arranged in the direction perpendicular to the third light-emitting portion 43, to adjust the resistance of the third sub-pixel corresponding to the third light-emitting portion 43 through the at least one second resistive structure 9, thereby increasing the turn-on voltage of the third sub-pixel. In this case, the turn-on voltages of the third sub-pixel and the first sub-pixel are basically same, to relieve the color crosstalk phenomenon between the first sub-pixel and the third sub-pixel when the display panel displays an image and improve the display quality of the display panel.

Further, in the pixel structure and the display panel including the pixel structure according to the embodiments of the present disclosure, the resistances of the at least one first resistive structure 6 and the at least one second resistive structure 9 may be adjusted to make the turn-on voltages of the first sub-pixel, the second sub-pixel and the third sub-pixel basically same, thereby relieving the color crosstalk phenomenon between any two adjacent sub-pixels of the first sub-pixel, the second sub-pixel and the third sub-pixel, and maximally improving the display quality of the display panel.

Figure 18:
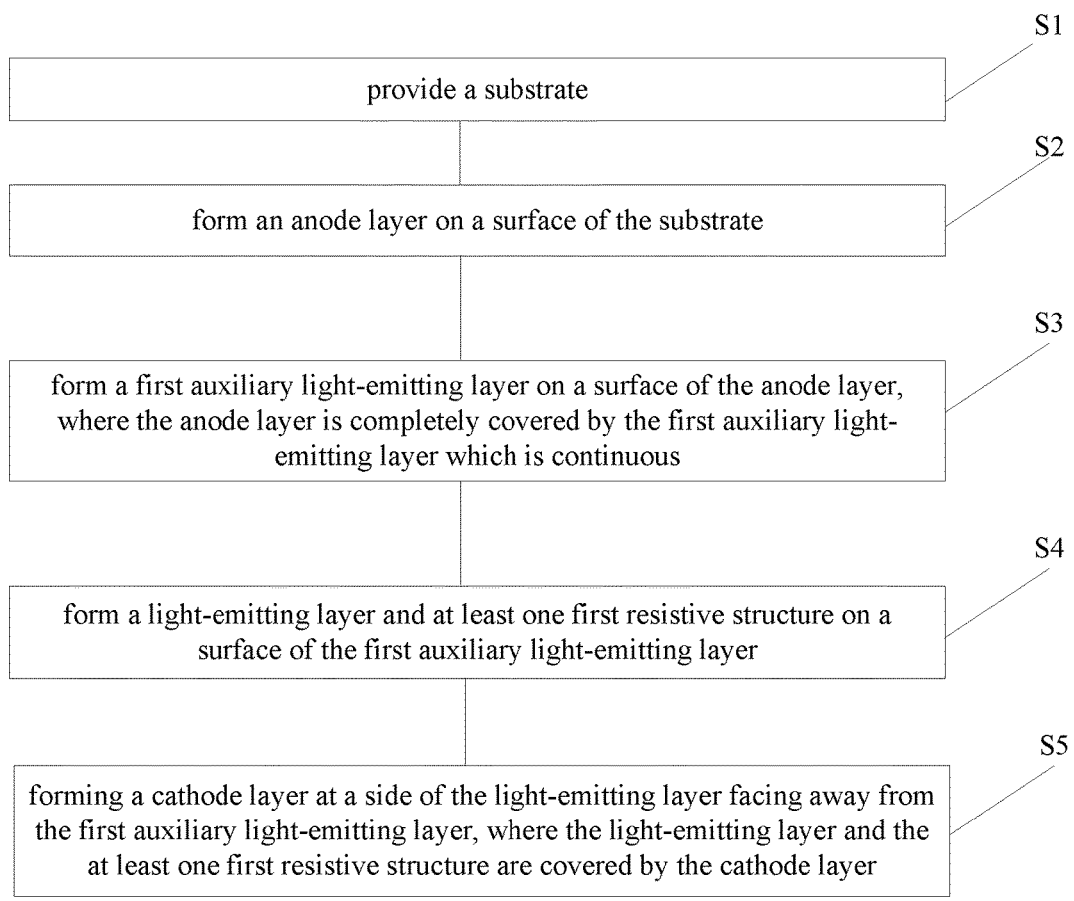
FIG. 18 is a flowchart of a method for manufacturing a pixel structure according to an embodiment of the disclosure.

Furthermore, a method for manufacturing a pixel structure is provided according to an embodiment of the disclosure, which is applied to the pixel structure according to any of the embodiments above. As shown in FIG. 18, the method includes steps S1 to S5.

At S1, a substrate is provided.

At S2, an anode layer on a surface of the substrate is formed.

At S3, a first auxiliary light-emitting layer on a surface of the anode layer is formed. The anode layer is completely covered by the first auxiliary light-emitting layer which is continuous.

At S4, a light-emitting layer and at least one first resistive structure on a surface of the first auxiliary layer are formed. The light-emitting layer at least includes a first light-emitting portion corresponding to a first sub-pixel and a second light-emitting portion corresponding to a second sub-pixel, a turn-on voltage of the first sub-pixel is greater than that of the second sub-pixel, the at least one first resistive structure is arranged in a direction perpendicular to the second light-emitting portion, at least partially overlaps with the second light-emitting portion and does not overlap with the first light-emitting portion, and an absolute value of a difference between a sum of resistances of the at least one first resistive structure and the second light-emitting portion and a resistance of the first light-emitting portion is less than a first predetermined value.

At S5, a cathode layer at a side of the light-emitting layer facing away from the first auxiliary light-emitting layer is formed. The light-emitting layer and the at least one first resistive structure are covered by the cathode layer.

Figure 19:
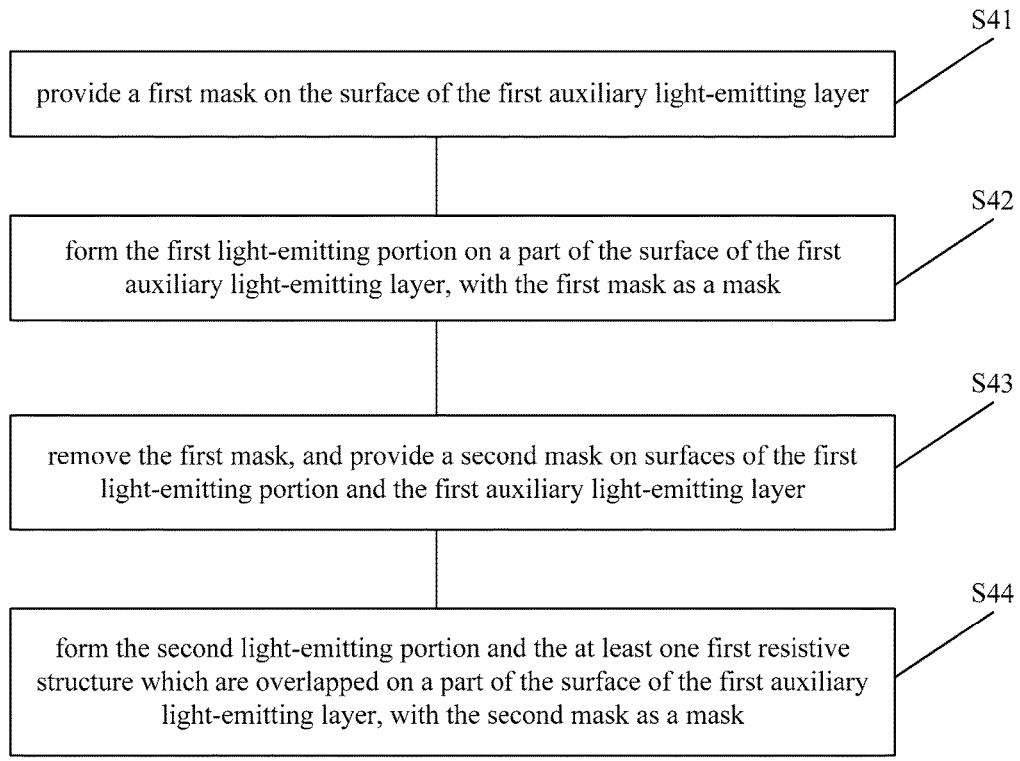
FIG. 19 is a flowchart of step 4 of a method for manufacturing a pixel structure according to an embodiment of the disclosure.

Based on the embodiment above, the forming a light-emitting layer and at least one first resistive structure on a surface of the first auxiliary layer, where the light-emitting layer at least includes a first light-emitting portion corresponding to a first sub-pixel and a second light-emitting portion corresponding to a second sub-pixel, as shown in FIG. 19, includes steps S41 to S44.

At S41, a first mask on the surface of the first auxiliary light-emitting layer is provided.

At S42, the first light-emitting portion on a part of the surface of the first auxiliary light-emitting layer is formed, with the first mask as a mask.

At S43, the first mask, and providing a second mask on surfaces of the first light-emitting portion and the first auxiliary light-emitting layer are removed.

At S44, the second light-emitting portion and the at least one first resistive structure are formed. The second light-emitting portion and the at least one first resistive structure are overlapped on a part of the surface of the first auxiliary light-emitting layer, with the second mask as a mask.

As seen from the above, one mask is used to form the second light-emitting portion and the at least one first resistive structure, thereby simplifying the process for manufacturing the pixel structure and improving the efficiency of manufacturing the pixel structure. It should be noted that, in a case that one mask is used to form the second light-emitting portion and the at least one first resistive structure, a process for forming the at least one first resistive structure preferably may be an evaporation process, an ink jet process or a coating process, as the case may be, which is not limited in the disclosure.

Based on the embodiment above, the forming the second light-emitting portion and the at least one first resistive structure includes successively forming the second light-emitting portion and the at least one first resistive structure on a part of the surface of the first auxiliary light-emitting layer, with the second mask as a mask. The second light-emitting portion and the at least one first resistive structure are overlapped on a part of the surface of the first auxiliary light-emitting layer, with the second mask as a mask. That is, the at least one first resistive structure is arranged between the second light-emitting portion and the cathode layer. In another embodiment of the disclosure, the forming the second light-emitting portion and the at least one first resistive structure which are overlapped on a part of the surface of the first auxiliary light-emitting layer, with the second mask as a mask, includes successively forming the at least one first resistive structure and the second light-emitting portion on a part of the surface of the first auxiliary light-emitting layer, with the second mask as a mask, that is, the at least one first resistive structure is arranged between the first auxiliary light-emitting layer and the second light-emitting portion, as the case may be, which is not limited in the disclosure.

Based on any of the embodiments above, in a case that the pixel structure includes a third light-emitting portion, the method can further include: forming the third light-emitting portion and at least one second resistive structure on a surface of the first auxiliary light-emitting layer facing the first light-emitting portion, where the at least one second resistive structure is arranged in a direction perpendicular to the third light-emitting portion, at least partially overlaps with the third light-emitting portion and does not overlap with the first light-emitting portion or the second light-emitting portion, and an absolute value of a difference between a sum of resistances of the third light-emitting portion and the at least one second resistive structure and the resistance of the first light-emitting portion is less than a second predetermined value.

It should be noted that, in the embodiment above, one mask may be used to form the at least one second resistive structure and the third light-emitting portion, to further simply the process for manufacturing the pixel structure and improve the efficiency of manufacturing the pixel structure. In a case that one mask is used to form the third light-emitting portion and the at least one second resistive structure, the at least one second resistive structure preferably may be formed by an evaporation process, an ink jet process or a coating process, as the case may be, which is not limited in the disclosure.

It should also be noted that, in the embodiment above, the at least one second resistive structure may be arranged between the third light-emitting portion and the cathode layer, or may be arranged between the first auxiliary light-emitting layer and the third light-emitting portion, as the case may be, which is not limited in the disclosure.

Based on any of the embodiments above, in a method according to an embodiment of the disclosure, the pixel structure is not limited to only include three light-emitting portions of the first light-emitting portion, the second light-emitting portion and the third light-emitting portion. In other embodiments of the disclosure, the pixel structure may include other light-emitting portions, as the case may be, which is not limited in the disclosure.

As seen from the above, in the pixel structure manufactured with the method according to the embodiment of the disclosure, at least one first resistive structure is arranged in the pathway between the first auxiliary light-emitting layer and the cathode layer and arranged in the direction perpendicular to the second light-emitting portion, to adjust the resistance of the second sub-pixel corresponding to the second light-emitting portion through the at least one first resistive structure, thereby increasing the turn-on voltage of the second sub-pixel. In this case, the turn-on voltages of the second sub-pixel and the first sub-pixel are basically same, to relieve the color crosstalk phenomenon between the first sub-pixel and the second sub-pixel when the display panel displays an image and improve the display quality of the display panel.

Moreover, in a case that the pixel structure includes a third light-emitting portion and the turn-on voltage of the third sub-pixel corresponding to the third light-emitting portion is different from the turn-on voltage of the sub-pixel corresponding to the first light-emitting portion, in the pixel structure manufactured with the method according to the embodiment of the disclosure, at least one second resistive structure may be arranged in the pathway between the first auxiliary light-emitting layer and the cathode layer and arranged in the direction perpendicular to the third light-emitting portion, to adjust the resistance of the third sub-pixel corresponding to the third light-emitting portion through the at least one second resistive structure, thereby increasing the turn-on voltage of the third sub-pixel. In this case, the turn-on voltages of the third sub-pixel and the first sub-pixel are basically same, to relieve the color crosstalk between the first sub-pixel and the third sub-pixel when the display panel displays an image and improve the display quality of the display panel.

Further, in the pixel structure manufactured with the method according to the embodiment of the disclosure, the resistances of the at least one first resistive structure and the at least one second resistive structure may be adjusted to make the turn-on voltages of the first sub-pixel, the second sub-pixel and the third sub-pixel basically same, thereby reliving the color crosstalk phenomenon between any two adjacent sub-pixels of the first sub-pixel, the second sub-pixel and the third sub-pixel, and maximally improving the display quality of the display panel.

The sections in the specification are described in a progressive manner, differences from the other sections are emphasized in each section, and reference can be made to each other for same or similar parts in the sections.

The above descriptions of the disclosed embodiments enable those skilled in the art realize or use the disclosure. Numerous modifications made to the embodiments according to the present disclosure are apparent to those skilled in the art, and general principles defined herein can be implemented in other embodiments without deviation from the spirit or scope of the disclosure. Hence, the disclosure is not limited to the embodiments disclosed herein, but is to conform to the widest scope in accordance with principles and novelties disclosed herein.

The invention claimed is:
1. A pixel structure, comprising:
   a substrate;
   an anode layer on a surface of the substrate;
   a first auxiliary light-emitting layer on a surface of the anode layer, wherein the anode layer is completely covered by the first auxiliary light-emitting layer which is continuous;
   a light-emitting layer comprising at least one of first light-emitting portions and at least one of second light-emitting portions, wherein the at least one of first light-emitting portions and the at least one of second light-emitting portions are arranged alternately on a surface of the first auxiliary light-emitting layer to form an array, the at least one of first light-emitting portions correspond to a plurality of first sub-pixels respectively, the at least one of second light-emitting portions correspond to a plurality of second sub-pixels respectively, and a turn-on voltage of the first sub-pixel is greater than a turn-on voltage of the second sub-pixel;
   a cathode layer on a surface of the light-emitting layer, wherein the light-emitting layer is covered by the cathode layer; and
   at least one of first resistive structures in a pathway between the first auxiliary light-emitting layer and the cathode layer, wherein
   the at least one of first resistive structures are arranged correspondingly to the at least one of the second light-emitting portions respectively, with each of the at least one of first resistive structures at least partially overlapping with the corresponding second light-emitting portion in a direction perpendicular to the light-emitting layer,
   wherein the at least one of the first resistive structures do not overlap with the at least one of first light-emitting portions in the direction perpendicular to the light-emitting layer,
   wherein an absolute value of a difference between a sum of resistances of each of the at least one of first resistive structures and the corresponding second light-emitting portion and a resistance of at least one of first light-emitting portions is less than a first predetermined value;
   wherein the at least one of first resistive structures are arranged between the light-emitting layer and the cathode layer;
   wherein a second auxiliary light-emitting layer is arranged between the cathode layer and the light-emitting layer; and
   wherein the second auxiliary light-emitting layer comprises a plurality of stacked second auxiliary light-emitting sub-layers, and the at least one of first resistive structure are arranged between any two adjacent second auxiliary light-emitting sub-layers.

2. The pixel structure according to claim 1, wherein an orthographic projection of the corresponding second light-emitting portion onto the substrate is completely covered by an orthographic projection of each of the at least one of first resistive structures onto the substrate.

3. The pixel structure according to claim 1, wherein the first predetermined value is less than or equal to a difference between the resistance of the second light-emitting portion and the resistance of the first light-emitting portion.

4. The pixel structure according to claim 3, wherein the at least one of first resistive structures are made of an organic conductive material or an inorganic conductive material.

5. The pixel structure according to claim 4, wherein the inorganic conductive material is selected from a group consisting of aluminum, silver, molybdenum, aluminum oxide, silver oxide and/or molybdenum oxide.

6. The pixel structure according to claim 4, wherein the at least one of first resistive structures have a thickness in a range from 5 nm to 30 nm, inclusive.

7. A method for manufacturing a pixel structure, the method comprising:
   providing a substrate;
   forming a anode layer on a surface of the substrate;
   forming a first auxiliary light-emitting layer on a surface of the anode layer, wherein the anode layer is completely covered by the first auxiliary light-emitting layer;
   forming a light-emitting layer and at least one of first resistive structures on a surface of the first auxiliary light-emitting layer, wherein
   the light-emitting layer comprises at least one of first light-emitting portions corresponding to a plurality of first sub-pixels respectively and at least one of second light-emitting portions corresponding to a second sub-pixels respectively, wherein the at least one of first light-emitting portions and the at least one of second light-emitting portions are arranged alternatively on a surface of the first auxiliary light-emitting layer to form an array,
   a turn-on voltage of the first sub-pixel is greater than a turn-on voltage of the second sub-pixel,
   wherein the at least one of first resistive structures are arranged correspondingly to the at least one of the second light-emitting portions respectively, with each of the at least one of first resistive structures
   at least partially overlapping with the corresponding second light-emitting portion in a direction perpendicular to the light-emitting layer,
   wherein the at least one of the first resistive structures does not overlap with the at least one of first light-emitting portions in the direction perpendicular to the light-emitting layer, and
   wherein an absolute value of a difference between a sum of resistances of each of the at least one of first resistive structures and the corresponding second light-emitting portion and a resistance of one of the at least one of first light-emitting portions is less than a first predetermined value;
   forming a second auxiliary light-emitting layer on a surface of the light-emitting layer; and
   forming a cathode layer at a side of the light-emitting layer facing away from the first auxiliary light-emitting layer, wherein the light-emitting layer and each of the at least one of first resistive structures are covered by the cathode layer;
   wherein the at least one of first resistive structures are arranged between the light-emitting layer and the cathode layer; and
   wherein the second auxiliary light-emitting layer comprises a plurality of stacked second auxiliary light-emitting sub-layers, and the at least one of first resistive structure are arranged between any two adjacent second auxiliary light-emitting sub-layers.

8. A display panel, comprising a pixel structure, wherein the pixel structure comprises:
   a substrate;

an anode layer on a surface of the substrate;
a first auxiliary light-emitting layer on a surface of the anode layer, wherein the anode layer is completely covered by the first auxiliary light-emitting layer which is continuous;
a light-emitting layer comprising at least one of first light-emitting portions and at least one of second light-emitting portions, wherein the at least one of first light-emitting portions and the at least one of second light-emitting portions are arranged alternately on a surface of the first auxiliary light-emitting layer to form an array, the at least one of first light-emitting portions correspond to a plurality of first sub-pixel respectively, the at least one of second light-emitting portions correspond to a plurality of second sub-pixel respectively and a turn-on voltage of the first sub-pixel is greater than a turn-on voltage of the second sub-pixel;
a cathode layer on a surface of the light-emitting layer, wherein the light-emitting layer is covered by the cathode layer; and
at least one of first resistive structures in a pathway between the first auxiliary light-emitting layer and the cathode layer, wherein
the at least one of first resistive structures are arranged correspondingly to the at least one of the second light-emitting portions respectively, with each of the at least one of first resistive structures at least partially overlapping with the corresponding second light-emitting portion in a direction perpendicular to the light-emitting layer
wherein the at least one of the first resistive structures do not overlap with the at least one of first light-emitting portions in the direction perpendicular to the light-emitting layer, and
wherein an absolute value of a difference between a sum of resistances of each of the at least one of first resistive structures and the corresponding second light-emitting portion and a resistance of one of the at least one of first light-emitting portions is less than a first predetermined value;
wherein the at least one of first resistive structures are arranged between the light-emitting layer and the cathode layer;
wherein a second auxiliary light-emitting layer is arranged between the cathode layer and the light-emitting layer; and
wherein the second auxiliary light-emitting layer comprises a plurality of stacked second auxiliary light-emitting sub-layers, and the at least one of first resistive structure are arranged between any two adjacent second auxiliary light-emitting sub-layers.

* * * * *